(12) United States Patent
Sanders

(10) Patent No.: US 7,260,122 B2
(45) Date of Patent: Aug. 21, 2007

(54) MODELESS WAVELENGTH-AGILE LASER

(75) Inventor: Scott T. Sanders, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 274 days.

(21) Appl. No.: 10/997,100

(22) Filed: Nov. 24, 2004

(65) Prior Publication Data

US 2006/0109872 A1 May 25, 2006

(51) Int. Cl.
*H01S 3/10* (2006.01)
(52) U.S. Cl. ............................ 372/20; 372/19; 372/33
(58) Field of Classification Search ............... 372/19, 372/20, 30
See application file for complete search history.

(56) References Cited

U.S. PATENT DOCUMENTS

| | | | |
|---|---|---|---|
| 5,319,668 A | 6/1994 | Luecke | |
| 5,450,202 A | 9/1995 | Tisue | |
| 5,867,512 A | 2/1999 | Sacher | |
| 6,625,183 B1 | 9/2003 | Hand et al. | |
| 6,636,536 B1 | 10/2003 | Tisue | |
| 6,683,895 B2 | 1/2004 | Pilgrim et al. | |
| 6,704,332 B2 * | 3/2004 | Chapman et al. | 372/20 |
| 6,731,661 B2 | 5/2004 | Trutna, Jr. | |
| 6,795,454 B2 | 9/2004 | Nebendahl | |
| 2002/0015427 A1 | 2/2002 | Pilgrim et al. | |
| 2002/0191651 A1 | 12/2002 | Funakawa | |

FOREIGN PATENT DOCUMENTS

| | | |
|---|---|---|
| EP | 0951112 A2 | 10/1999 |
| WO | WO 2004/086572 A2 | 10/2004 |

OTHER PUBLICATIONS

Akio Yoshizawa, et al, Chirped-comb generation in frequency-shifted feedback laser diodes with a large frequency shift, Optics Communications 155 (1998) 51-54, Japan.
Oct. 1, 1998 Elsevier Science B.V.
Karen Liu, et al., Novel geometry for single-mode scanning of tunable lasers, Optical Society of America, 1981, Princeton, New Jersey.
M.J. Lim, et al., Improved design of a frequency-shifted feedback diode laser for optical pumping at high magnetic field, Optics Communications 147 (1998) 99-102.
Ann Arbor, MI, 1998 Elsevier Science B.V.
Kranendonk L. A. et al: "Modeless operation of a wavelength-agile laser by high-speed cavity length changes", Optics Express Opt. Soc. of America USA, vol. 13, No. 5, Mar. 7, 2005, USA.
Sanders, S. T.: "Wavelength-agile fiber laser using group-velocity dispersion of pulsed super-continua and application to broadband absorption spectroscopy", Applied Physics B (Lasers and Optics) Springer-Verlag Germany, vol. B75, No. 6-7.

(Continued)

Primary Examiner—Dung T. Nguyen
(74) Attorney, Agent, or Firm—Boyle Fredrickson Newholm Stein & Gratz S.C.

(57) ABSTRACT

An external cavity laser may be swept rapidly in frequency and cavity length to prevent formation of modes providing improved spectral response and light characteristics.

20 Claims, 1 Drawing Sheet

OTHER PUBLICATIONS

Lim, M.J. et al.: "Improved design of a frequency-shifted feedback diode laser for optical pumpling at high magnetic field," Optics Communications 147 (1998) 99-102, Elsevier, UK.

Yoshizawa, Akio, et al.: "Chirped-comb generation in frequency-shifted feedback laser diodes with a large frequency shift," Optics Communications 155 (1998) 51-54, Elsevier, UK.

Liu, Karen et al.: "Novel geometry for single-mode scanning of tunable lasers," Optics Letter, Mar. 1981, vo. 6, No. 6, Optical Society of America, USA.

* cited by examiner

MODELESS WAVELENGTH-AGILE LASER

STATEMENT REGARDING FEDERALLY SPONSORED RESEARCH OR DEVELOPMENT

This invention was made with United States government support awarded by the following agencies: NSF 0307455. The United States has certain rights in this invention.

BACKGROUND OF THE INVENTION

The present invention relates to lasers and more particularly to a laser providing a rapidly sweeping light frequency without laser modes.

Spectroscopic studies evaluate the "spectrographic" response of a material to different frequencies of light. The spectrographic response may be light absorption, reflectivity, scattering, fluorescence or other features.

Spectrographic studies may be used to investigate gases, liquids, aerosols, solids, particulates, and the like, as their physical properties change in response to temperature, pressure, velocity, composition, size, stress and strain. Similar techniques may be used to monitor sensors incorporating materials whose spectrographic responses change as a function of a physical parameter to be measured.

Spectroscopic studies may use a "wavelength-agile" light source providing a spectrally narrow light beam that may be quickly and controllably swept in frequency. One implementation of a wavelength-agile light source employs a laser incorporating a spectral filter into its optical cavity and changing the frequency of that filter during operation of the laser.

One common spectral filter is a diffraction grating. The diffraction grating may be tipped with respect to an incident laser beam to adjust the effective spacing of the grating's rule lines along the beam and hence the frequency of light preferentially reflected by the grating. As the grating is moved to change the frequency of the laser beam, the length of the optical cavity is ordinarily adjusted to match the beam's wavelength to maintain optical resonance. This optical resonance, resulting from standing light waves created by laser cavity elements such as mirrors, is termed a "mode". At any given laser mode, stimulated emissions by the laser material produce a phase coherence in the emitted light. This phase coherence can produce a phenomenon termed "speckle" in which light from the laser constructively adds or destructively cancels at given points.

A laser system providing simultaneous adjustment of a diffraction grating for frequency selection and optical cavity length to preserve optical resonance is described in U.S. Pat. No. 5,319,668 hereby incorporated by reference.

Spectrographic analysis of short optical phenomena with a wavelength agile laser requires the ability to rapidly change the laser frequency. This speed of frequency change can be limited by mechanical constraints incident to coordinated movement of the optical grating and change in cavity length. At high speeds of frequency change, the laser may "mode hop" jumping from one mode to another mode separated by a substantial wavelength difference. Such a problem is described in U.S. Pat. No. 6,683,895, at col. 2, lines 27 through 30.

BRIEF SUMMARY OF THE INVENTION

The present invention provides a wavelength agile laser changing its cavity length at a speed found to substantially prevent the formation of laser modes. The result is a spectrally narrow, swept-wavelength light source that is resistant to mode hopping because of the absence of laser modes. Furthermore, the output light has random phase, resulting in reduced speckle. In a preferred embodiment, a pivoting mirror design provides the high rate of cavity length change.

Specifically then, the present invention provides a modeless laser having a laser element (a gain medium and an associated pump). An optical system defines a cavity receiving the photons from the laser material and reflecting the photons back to the laser material. The cavity has an instantaneous effective length, which is rapidly varied so as to substantially prevent a formation of resonant modes.

Thus, it is one object of at least one embodiment of the invention to avoid the formation of laser modes such as may cause "mode hopping" or produce speckle.

The speed at which the cavity length must be changed is such that, in the time it takes light to cycle through the cavity, the length is changed by an appreciable fraction of the wavelength. Typically speeds of approximately one kilometer per second or more, or changes of one percent of the wavelength per round trip transit time of the photons are required.

Thus, it is another object of at least one embodiment of the invention to provide a laser cavity mechanism producing high rates of cavity length change.

The cavity length may change by no less than ⅛ of a wavelength of emitted photons during a period defined by the round trip transit time of the photons along the cavity length and preferably no less than 1% of that wavelength.

Thus, it is another object of at least one embodiment of the invention to produce rapid change in the cavity length to produce modeless operation.

The means for varying the length of the cavity may include a mirror pivoting about an axis to direct photons to a retro reflector having a surface with different portions of varying distance from the mirror.

Thus, it is an object of at least one embodiment of the invention to provide a mechanical system that can produce a virtually unbounded rate of change of cavity length with pivoting movements of a single mirror element.

The mirror may pivot using a reciprocating actuator or may be a polygonal prism having a reflective periphery and a motor for pivoting the prism about a central axis.

Thus, it is another object of at least one embodiment of the invention to provide a system that may be flexibly implemented to produce varying functions of frequency agility.

The retro reflector may be a diffraction grating.

Thus, it is one object of at least one embodiment of the invention to combine the functions of frequency selectivity and retro-reflector for cavity length change in a single optical element.

The optical system may separately provide a means for varying the wavelength of the photons and for varying the cavity length independently of the wavelength of the photons to substantially prevent formation of resonant modes.

Thus, it is another object of at least one embodiment of the invention to create the possibility of suppressing resonant modes by independently varying photon frequency and cavity length so as to upset the formation of standing resonant modes.

These particular objects and advantages may apply to only some embodiments falling within the claims and thus do not define the scope of the invention.

DETAILED DESCRIPTION OF THE PREFERRED EMBODIMENT

Figure 1:
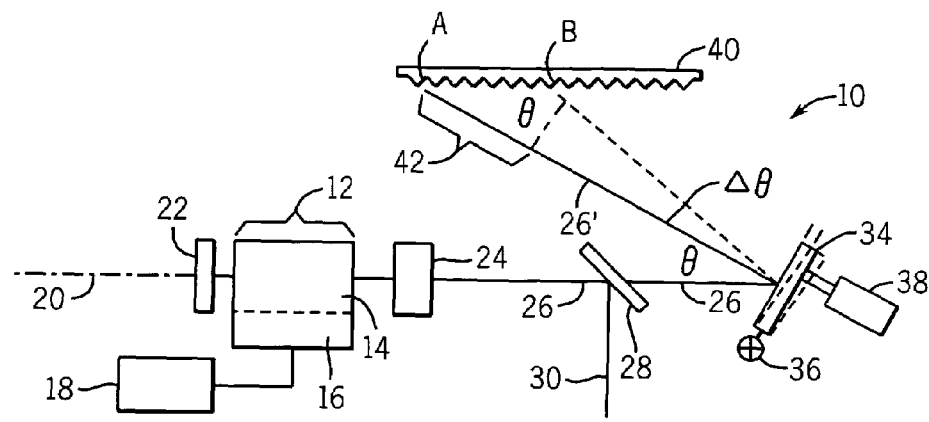
FIG. 1 is a block diagram of a laser of the present invention providing modeless frequency-agile operation.

Referring now to FIG. 1, a frequency agile modeless laser 10 includes a laser source 12 providing a laser medium 14 such as supports the stimulated emission of photons, and an energy pump 16 and power supply 18 exciting the of the laser medium 14 into a stimulated state.

The laser medium 14 is preferably a solid-state material forming part of a solid-state laser diode, for example, in which case the pump 16 is an electrode of the diode. More generally, the laser medium 14 may be any suitable laser material and the pump 16 may be an optical or electrical pump for stimulating the electrons of the laser medium 14 as will be understood in the art.

The laser medium 14 may emit photons along an optical axis 20 extending through a front and rear surface of the laser medium 14. At the rear surface of the laser medium, the optical axis 20 is intercepted by a mirror 22 which reflects emitted photons back into the laser medium 14. The photons emitted from the front surface of the laser medium 14 may be received by a lens assembly 24 of a type well known in the art to direct a focused beam 26 of photons further along the optical axis 20.

The beam 26 is received by a beam splitter 28 directing a portion 30 of the beam 26 at right angles to the optical axis 20 for use in spectrographic purposes. The remainder of the beam 26 passes to a front surface, pivoting mirror 34 which may direct a diverted beam 26' at an acute angle θ with respect to the optical axis 20. Pivoting mirror 34 turns about a pivot point 36 so that the angle θ may be changed by an amount Δθ during reciprocation of the mirror about the pivot point 36 by a piezoelectric transducer 38 or the like.

The diverted beam 26' from pivoting mirror 34 may be received by a diffraction grating 40 having a ruled face toward the diverted beam 26' and being arrayed generally (but not necessarily) parallel to the optical axis 20. The pivoting of the pivoting mirror 34 changes a point at which the center of the diverted beam 26' strikes the diffraction grating 40 from point A furthest from the pivoting mirror 34 to point B closest to the pivoting mirror 34, both points A and B being on the ruled face of the diffraction grating 40.

The incident angle at which diverted beam 26' intersects the surface of diffraction grating 40 will vary as a function of where the diverted beam 26' intersects the surface of diffraction grating 40. This angle (θ in the case of an axis parallel diffraction grating 40) is smaller at point A than at point B. Generally this angle determines the dominant frequency of the reflection of the diverted beam 26' off of the diffraction grating 40.

The frequency selecting qualities of the diffraction grating 40 result from the constructive adding of light frequencies reflected off of each ruling of the diffraction grating 40 for a particular frequency as determined by the grating periodicity projected onto the axis of diverted beam 26'. Thus, generally at point A, the diffraction grating 40 will selectively reflect lower frequency light and at point B will selectively reflect higher frequency of light.

Figure 2:
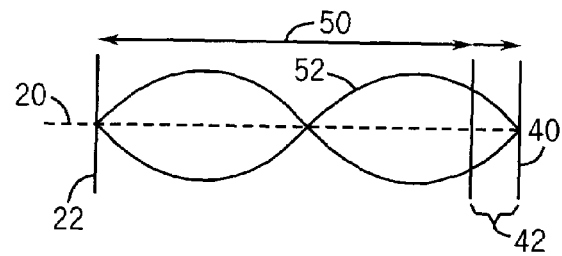
FIG. 2 is a diagrammatic representation of the cavity length of the laser of FIG. 1 showing a rate of change of cavity length in proportion to the wavelength of photons along the cavity during a round trip passage of the photos through the cavity.

Referring now to FIGS. 1 and 2, an effective optical cavity length 50 is defined as the apparent optical distance between the front surface of mirror 22 and the point of intersection along a line between A or B on the front surface of the diffraction grating 40. The effective optical cavity length 50 will generally be the geometric length as modified by the light speed of materials interposed into the cavity. During mode operation of a typical laser, this cavity length is an integer number of wavelength of the frequency of the light of the beam 26, 26' such as creates a standing wave 52.

The movement of the pivoting mirror 34 described above changes the point of intersection of diverted beam 26' and diffraction grating 40, and thus the cavity length 50 of the laser 10 by an distance 42. It will be understood that by decreasing angle θ, the distance 42 may be arbitrarily increased for a given value of Δθ. Thus, small motion of pivoting mirror 34 may create extremely large change in cavity length 50. Thus, for example, with audio frequency oscillation of the pivoting mirror 34, for example, at 10,000 hertz or greater, a distance 42 of 1/10 of a meter will provide a change in the optical cavity length 50 of one kilometer per second or greater.

During operation of the device of FIG. 1, the cavity length 50 is rapidly varied to prevent the formation of modes. The necessary speed of change of the optical cavity length 50 is believed to be a function of the wavelength of the light of beam 26. A suitable change in optical cavity length 50, during a round trip propagation of light from mirror 22 to diffraction grating 40 and back, is at least 1/8 of a wavelength or at least 1% of the wavelength.

While the inventors do not wish to be bound by a particular theory, it is believed that this rapid change in cavity length and light frequency prevents the cascading stimulation of coherent photons such as are necessary to create a mode while still allowing sufficient stimulated emission to promote acceptable energy at the given wavelength frequency. The lack of mode formation is believed to prevent mode-hopping and to allow a smoother and more reliable sweeping of light frequency with reduced amplitude variations.

Movement of the pivoting mirror 34 not only changes the cavity length but also changes the preferential frequency of the photons reflected back from the diffraction grating 40. The relative geometry of pivoting mirror 34 and diffraction grating 40 described with respect to FIG. 1 may match wavelength of the photons to cavity length. That is, increases in cavity length caused by movement of the pivoting mirror 34 may cause the diverted beam 26' to strike the diffraction grating 40 at an angle to promote a frequency whose wavelength times an integer substantially equals the cavity length.

Alternatively, it will be understood that the frequency selectivity of the diffraction grating 40 may be made independent of the instantaneous length of the cavity length by adjustment of the geometry of the diffraction grating 40 and pivoting mirror 34, so that frequency selected by the diffraction grating 40 may diverge from an integer division of the cavity length. While the inventors do not wish to be bound by a particular theory, it may be a mismatch between frequency and cavity length helps promote modeless operation.

Figure 4:
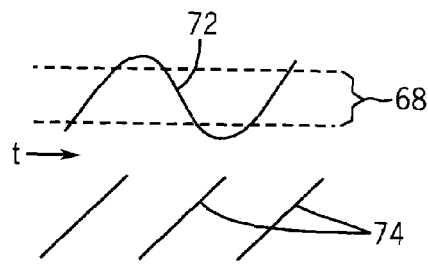
FIG. 4 is a plot of frequency versus time for the embodiments of FIG. 1 and FIG. 2 showing regions of modeless operation for each.

Referring now to FIG. 4, in an alternative embodiment to the mirror mechanism of FIG. 1, pivoting mirror 34 may be replaced with rotating mirror 60 being a polygonal prism, in this case having an octagonal cross section rotated about its axis 62 such as forms a pivot, and having a reflective outer periphery 64 for reflecting beam 26'. The diverted beam 26 may be received by a retro reflector 66 allowing cavity length changes with changing angle θ. Note that the retro reflector 66 need not be parallel to the optical axis 20 and need not be a diffraction grating, but may be other retro reflective material including a series of corner reflectors or transparent sphere type retro reflector surfaces. Frequency selection in this case may be provided by other means well known in the art.

Referring now to FIG. 4, the cavity length, as a function of time for the embodiment of FIG. 1, will be a generally sinusoidal-shaped curve 72 defined by the reciprocation of the pivoting mirror 34. Curve 72 provides a variable rate of change of cavity length possibly limiting modeless operation to restricted range 68 permitting the laser 10 to revert to a modal operation at times near when the pivoting mirror 34 changes direction. These periods of modal operation may be reduced by rapid oscillation or may be acceptable during spectrographic scanning representing only the limits of the frequency range.

Figure 3:
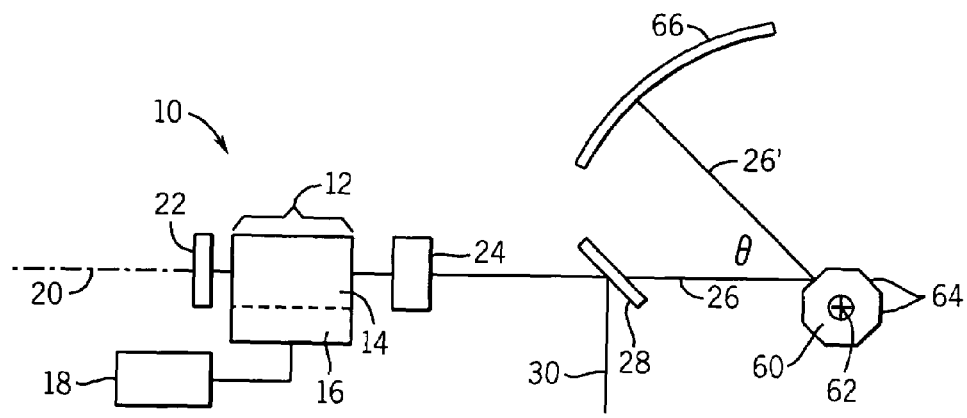
FIG. 3 is an alternative embodiment of the mirror assembly of FIG. 1 such as provides for a linear sweeping of frequency versus time.

In contrast, the polygonal mirror of FIG. 3 provides for a set of discontinuous ramp-shaped curves 74 having a constant rate of cavity length change believed to provide no lapse into modal operation.

It is specifically intended that the present invention not be limited to the embodiments and illustrations contained herein, but include modified forms of those embodiments including portions of the embodiments and combinations of elements of different embodiments as come within the scope of the following claims. For example, other methods of changing the effective optical cavity length, including electronically or acoustically modulated elements, may be used.

I claim:

1. A modeless frequency agile laser comprising:
   a laser element having a laser material and a power source for pumping the laser material into excitation to promote stimulated emission of photons from the laser material;
   an optical system defining a cavity receiving the photons from the laser material and reflecting the photons back to the laser material along a cavity length; and
   means for varying an effective length of the cavity to substantially prevent a formation of resonant optical modes
   wherein the effective cavity length is changed by no less than 100 meters per second.

2. The modeless laser of claim 1 wherein the effective cavity length is changed by no less than one kilometer a second.

3. A modeless frequency agile laser comprising:
   a laser element having a laser material and a power source for pumping the laser material into excitation to promote stimulated emission of photons from the laser material;
   an optical system defining a cavity receiving the photons from the laser material and reflecting the photons back to the laser material along a cavity length; and
   means for varying an effective length of the cavity to substantially prevent a formation of resonant optical modes
   wherein the effective cavity length changes by no less than one percent of a wavelength of emitted photons during a period defined by a round trip transit time of the photons along the effective cavity length.

4. The modeless laser of claim 3 wherein the effective cavity length changes by no less than one eighth of a wavelength of emitted photons during a period defined by a round trip transit time of the photons along the effective cavity length.

5. The modeless laser of claim 3 wherein the means for varying a dominant frequency of the photons and the effective length of the cavity includes a mirror pivoting about an axis to direct the photons to a retro reflector having a surface with different portions of varying distance to the mirror.

6. The modeless laser of claim 5 further including a reciprocating actuator for pivoting the mirror.

7. The modeless laser of claim 5 wherein the mirror is a polygonal prism having a reflective periphery and further including a motor for rotating the polygonal prism about its central axis.

8. The modeless laser of claim 5 wherein the retro reflector is a diffraction grating.

9. A modeless frequency agile laser comprising:
   a laser element having a laser material and a power source for pumping the laser material into excitation to promote stimulated emission of photons from the laser material;
   means for varying a dominant frequency of the photons emitted by the laser material to provide a swept spectrally narrow beam of light substantially free of resonant optical modes.
   wherein the means for varying the dominant frequency includes a diffraction grating changing in relative angle to an axis along which the photons pass to selectively reflect a spectrally narrow range of photons of changing frequency;
   wherein the means for varying the dominant frequency of the photons includes a mirror pivoting about an axis to direct the photons to the diffraction grating at varying angles;
   further including a reciprocating actuator for pivoting the mirror;
   wherein the mirror pivoting about the axis further changes an effective cavity length measured from the laser material to the diffraction grating along a path of the photons;
   wherein the effective cavity length is changed by no less than 100 meters per second.

10. The modeless laser of claim 9 wherein the effective cavity length is changed by no less than one kilometer a second.

11. The modeless laser of claim 9 wherein the effective cavity length changes by no less than one eighth of a wavelength of emitted photons during a period defined by a round trip transit time of the photons along the effective cavity length.

12. The modeless laser of claim 9 wherein the effective cavity length changes by no less than one percent of a wavelength of emitted photons during a period defined by a round trip transit time of the photons along the effective cavity length.

13. A modeless frequency agile laser comprising:
- a laser element having a laser and power source for pumping electrons of the laser material into excitation to generate photons emitting from the laser material;
- an optical system defining a cavity receiving photons from the laser material and reflecting them along a cavity length back to the laser material for stimulating photon emissions;
- means for varying a wavelength of the photons; and
- means for varying the cavity length independently of a wavelength of the photons to substantially prevent a formation of resonant modes
- wherein the cavity length is changed by no less than 100 meters per second.

14. The method of claim 13 wherein the cavity length is changed by no less than one kilometer a second.

15. The method of claim 13 wherein the cavity length changes by no less than one eighth of a wavelength of emitted photons during a period defined by a round trip transit time of the photons along the cavity length.

16. The method of claim 13 wherein the cavity length changes by no less than one percent of a wavelength of emitted photons during a period defined by a round trip transit time of the photons along the cavity length.

17. The method of claim 13 wherein the step of varying the cavity length is accomplished by a mirror pivoting about an axis to direct the photons to a retro reflector having a surface with different portions of varying distance to the mirror.

18. The method of claim 17 further including the step of employing a reciprocating actuator for pivoting the mirror.

19. The method of claim 17 including the step of employing a motor for rotating the mirror.

20. The method of claim 17 wherein the retro reflector is a diffraction grating.

* * * * *

UNITED STATES PATENT AND TRADEMARK OFFICE
CERTIFICATE OF CORRECTION

PATENT NO. : 7,260,122 B2 Page 1 of 1
APPLICATION NO. : 10/997100
DATED : August 21, 2007
INVENTOR(S) : Scott T. Sanders It is certified that error appears in the above-identified patent and that said Letters Patent is hereby corrected as shown below:

Title Page, item 56

UNDER REFERENCES CITED

Add --2004/0153175  A1  8/2004  Tisue--
(Cited in Supplemental IDS by Applicant,
submitted 10/17/2006)

Signed and Sealed this

Twenty-sixth Day of January, 2010

David J. Kappos
*Director of the United States Patent and Trademark Office*